(12) United States Patent
Takahashi et al.

(10) Patent No.: US 8,980,968 B2
(45) Date of Patent: Mar. 17, 2015

(54) PHOTOSENSITIVE RESIN COMPOSITION, METHOD FOR PRODUCING STRUCTURE, AND LIQUID DISCHARGE HEAD

(75) Inventors: Hyo Takahashi, Kawasaki (JP); Ken Ikegame, Atsugi (JP); Masako Shimomura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 61 days.

(21) Appl. No.: 13/576,895

(22) PCT Filed: Feb. 1, 2011

(86) PCT No.: PCT/JP2011/000549
§ 371 (c)(1),
(2), (4) Date: Aug. 2, 2012

(87) PCT Pub. No.: WO2011/096195
PCT Pub. Date: Aug. 11, 2011

(65) Prior Publication Data
US 2012/0292412 A1    Nov. 22, 2012

(30) Foreign Application Priority Data
Feb. 5, 2010    (JP) .................... 2010-024681

(51) Int. Cl.
| | | |
|---|---|---|
| C08G 59/68 | (2006.01) | |
| C08F 2/50 | (2006.01) | |
| C09D 11/102 | (2014.01) | |
| C09D 11/101 | (2014.01) | |
| B41J 2/16 | (2006.01) | |
| G03F 7/004 | (2006.01) | |
| G03F 7/038 | (2006.01) | |
| G03F 7/40 | (2006.01) | |

(52) U.S. Cl.
CPC ............ B41J 2/1603 (2013.01); B41J 2/1639 (2013.01); G03F 7/0045 (2013.01); G03F 7/0046 (2013.01); G03F 7/038 (2013.01); G03F 7/40 (2013.01)
USPC ............ 522/31; 522/27; 522/28; 522/53; 522/67; 522/168; 522/170; 430/285.1; 430/325; 430/281.1; 239/589

(58) Field of Classification Search
USPC .................. 522/27, 28, 53, 67, 31, 168, 170; 430/285.1, 325, 281.1; 239/589
See application file for complete search history.

(56) References Cited

U.S. PATENT DOCUMENTS

| | | | |
|---|---|---|---|
| 5,218,376 A | 6/1993 | Asai | |
| 5,639,802 A * | 6/1997 | Neckers et al. ................. | 522/25 |
| 6,155,673 A | 12/2000 | Nakajima | |
| 2008/0153030 A1 | 6/2008 | Kobayashi et al. | |
| 2008/0292993 A1 | 11/2008 | Ishikura | |
| 2008/0311511 A1 | 12/2008 | Senzaki et al. | |

FOREIGN PATENT DOCUMENTS

| | | |
|---|---|---|
| CN | 1195356 A | 10/1998 |
| CN | 1637052 A | 7/2005 |
| CN | 101091138 A | 12/2007 |
| CN | 101334588 A | 12/2008 |
| GB | 1526923 A | 10/1978 |
| JP | 51-056885 A | 5/1976 |
| JP | H07-145346 A | 6/1995 |
| JP | 08-157510 A | 6/1996 |
| JP | 09012615 A | 1/1997 |
| JP | H09-025393 A | 1/1997 |
| JP | 10-007680 A | 1/1998 |
| JP | 10152554 A | 6/1998 |
| JP | 10-212286 A | 8/1998 |
| JP | H11-322900 A | 11/1999 |
| JP | 2000321416 A | 11/2000 |
| JP | 2004-503392 A | 2/2004 |
| JP | 2004-131591 A | 4/2004 |
| JP | 2005-187799 A | 7/2005 |
| JP | 2006-227544 A | 8/2006 |
| JP | 2006-241384 A | 9/2006 |
| JP | 2007-034153 A | 2/2007 |
| JP | 2008-158339 A | 7/2008 |
| JP | 2008-173971 A | 7/2008 |
| JP | 2008-256980 A | 10/2008 |
| JP | 2008-292993 A | 12/2008 |
| JP | 2009-244779 A | 10/2009 |
| JP | 2009-258506 A | 11/2009 |
| JP | 2009-269849 A | 11/2009 |
| JP | 2010-276623 A | 12/2010 |
| WO | 2010/001919 A1 | 1/2010 |
| WO | 2010/143560 A | 12/2010 |

OTHER PUBLICATIONS

U.S. Appl. No. 13/576,906, filed Aug. 2, 2012, Hyo Takahashi.

* cited by examiner

*Primary Examiner* — Sanza McClendon
(74) *Attorney, Agent, or Firm* — Canon U.S.A., Inc. IP Division

(57) ABSTRACT

A photosensitive resin composition includes (a) a compound polymerizable in the presence of an acid, and (b) a photoacid generating agent including an onium salt having a cationic part structure represented by formula (b1) below and an anionic part structure represented by formula (b2) below, wherein the component (b) absorbs 50% or more of the amount of 365 nm wavelength light absorbed by the photosensitive resin composition, (b1)

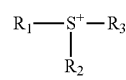

(b2)

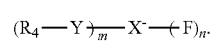

15 Claims, 9 Drawing Sheets

PHOTOSENSITIVE RESIN COMPOSITION, METHOD FOR PRODUCING STRUCTURE, AND LIQUID DISCHARGE HEAD

TECHNICAL FIELD

The present invention relates to a photosensitive resin composition, a method for producing a structure, and a liquid discharge head.

BACKGROUND ART

A known micro-fabrication technique includes a photolithographic technique including subjecting a negative-type photosensitive resin to exposure to light and development to form a patterned structure. This technique is widely used in applications such as semiconductor integrated circuit production applications, semiconductor exposure mask production applications, and applications of the production of various microelectromechanical systems (MEMS). In an example of the MEMS production application, the technique is used for the production of liquid discharge head nozzles. Steppers with i-line light sources are widely used as exposure devices. In the field of this technique, the production of more complicated and sophisticatedly-shaped structures has recently been demanded, and therefore, a negative-type photosensitive resin exhibiting high photosensitivity to light from a light source and high shaping accuracy has been demanded.

Japanese Patent Application Laid-Open No. 2008-256980 discusses a photosensitive resin composition which contains a polyfunctional epoxy resin and a cationic polymerization initiator as an example of such a negative-type photosensitive resin.

U.S. Pat. No. 6,155,673 discusses an example of the structure of a liquid discharge device having nozzles in which bubbles produced by heating a heat resistor are allowed to communicate with outside air so that ink droplets can be discharged.

However, the above composition does not have satisfactory properties in some cases for the reason below. For example, when a complicated structure such as a tapered discharge port for a liquid discharge device is formed using such a negative-type photosensitive resin composition and an i-line light source, an undesired shape such as a partially-rounded edge may be formed.

SUMMARY OF INVENTION

The present invention is directed to a photosensitive resin composition with which a structure can be formed with high sensitivity and high shaping accuracy using i-line photolithography.

According to an aspect of the present invention, there is provided a photosensitive resin composition including: (a) a compound polymerizable in the presence of an acid; and (b) a photoacid generating agent including an onium salt having a cationic part structure represented by formula (b1) below and an anionic part structure represented by formula (b2) below, wherein the component (b) absorbs 50% or more of the amount of 365 nm wavelength light absorbed by the photosensitive resin composition,

[Chem. 1]

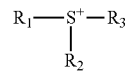

(b1)

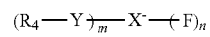

(b2)

wherein $R_1$ to $R_3$ each independently represent an organic group of 1 to 30 carbon atoms; $R_1$ to $R_3$ represent structures containing at least two oxygen atoms and including at least one organic group selected from a thioxanthone skeleton, a 9,10-dialkoxyanthracene skeleton, or an anthraquinone skeleton; X is selected from a carbon atom, a nitrogen atom, a phosphorus atom, a boron atom, and an antimony atom; Y is at least one selected from —S(=O)$_2$—, —CF$_2$—O—, —CF$_2$—C(=O)—, —CF$_2$—C(=O)—O—, and —CF$_2$—O—C(=O)—, or X and $R_4$ are directly bonded to each other; $R_4$ represents a hydrocarbon group of 1 to 30 carbon atoms, provided that when Y represents —S(=O)$_2$— or a single bond, the hydrocarbon group represented by $R_4$ has at least one fluorine atom; and when X represents a carbon atom, m and n represent integers that satisfy m+n=3 and n=0 to 2, when X represents a nitrogen atom, m and n represent integers that satisfy m+n=2 and n=0 to 1, when X represents a phosphorus or antimony atom, m and n represent integers that satisfy m+n=6 and n=0 to 6, or when X represents a boron atom, m and n represent integers that satisfy m+n=4 and n=0 to 3.

According to an exemplary embodiment of the present invention, there is provided a photosensitive resin composition with which a structure can be formed with high sensitivity and high shaping accuracy using i-line photolithography.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the present invention and, together with the description, serve to explain the principles of the invention.

DESCRIPTION OF EMBODIMENTS

Figure 1:
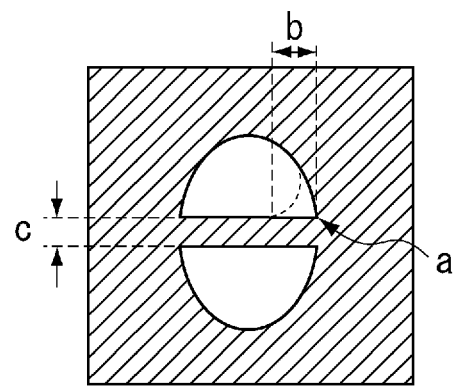
FIG. 1 is a diagram illustrating a mask for use in forming a model pattern in an exemplary embodiment of the present invention.

Various exemplary embodiments, features, and aspects of the invention will be described in detail below with reference to the drawings.

<Photosensitive Resin Composition>

The photosensitive resin composition according to an exemplary embodiment of the present invention is described in detail below.

<(a) Compound Polymerizable in the Presence of Acid>

The photosensitive resin composition according to an exemplary embodiment of the present invention contains a compound (component (a)) polymerizable in the presence of an acid. The compound polymerizable in the presence of an acid may be any cationically polymerizable compound such as an epoxy compound, an oxetane compound, or a cationically polymerizable vinyl compound. For the formation of a thick film using the photosensitive resin composition, an epoxy compound is preferred, and a polyfunctional epoxy compound having two or more epoxy groups is preferred. The number of functional groups in the polyfunctional epoxy compound is preferably five or more.

Examples of the polyfunctional epoxy compound include a polyfunctional alicyclic epoxy resin, a polyfunctional phenol novolac epoxy resin, a polyfunctional o-cresol novolac epoxy resin, a polyfunctional triphenyl-type novolac epoxy resin, and a polyfunctional bisphenol-A novolac epoxy resin. In particular, a polyfunctional bisphenol-A novolac epoxy resin or a polyfunctional alicyclic epoxy resin is preferred. Examples of a commercially available polyfunctional epoxy compound include Epicoat 157S70 (trade name) manufactured by Japan Epoxy Resins Co., Ltd., EPICLON N-865 (trade name) manufactured by DIC Corporation, and EHPE 3150 (trade name) manufactured by DAICEL CHEMICAL INDUSTRIES, LTD.

The component (a) is preferably a solid at room temperature (24 degrees Celsius). The softening point of the component (a) is preferably, but not limited to, 50 to 180 degrees Celsius, more preferably 60 to 160 degrees Celsius.

A single component (a) or two or more components (a) may be used alone or in combination. The content of the component (a) in the photosensitive resin composition is preferably from 60 to 99.9% by weight, more preferably from 80 to 99.9% by weight, even more preferably from 85 to 99.2% by weight, based on the total solids of the photosensitive resin composition. The photosensitive resin composition having a component (a) content in the above range can form a resist layer with high sensitivity and suitable hardness when applied to a supporting material.

<(b) Photoacid Generating Agent>

The photosensitive resin composition according to an exemplary embodiment of the present invention contains a photoacid generating agent (component (b)). The photoacid generating agent (component (b)) includes an onium salt having the ability to produce an acid upon exposure to i-line, specifically light at a wavelength of 365 nm, and having a cationic part structure represented by formula (b1) below and an anionic part structure represented by formula (b2) below.

[Chem. 2]

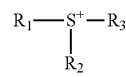

(b1)

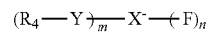

(b2)

An example of the component (b) including an onium salt having a cationic part structure represented by formula (b1) and an anionic part structure represented by formula (b2) is illustrated below.

[Chem. 3]

Example of formula (b1)

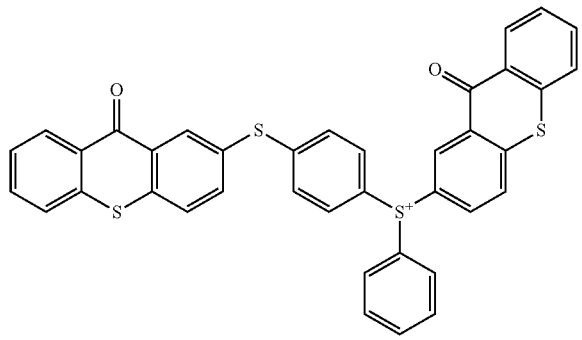

Example of formula (b2)

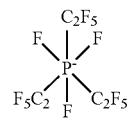

In formula (b1), $R_1$ to $R_3$ each independently represent an organic group of 1 to 30 carbon atoms, and $R_1$ to $R_3$ represent structures containing two or more oxygen atoms and including at least one organic group selected from a thioxanthone skeleton, a 9,10-dialkoxyanthracene skeleton, or an anthraquinone skeleton. Since the photoacid generating agent has the cationic part structure represented by formula (b1), the absorption wavelength shifts toward longer wavelengths, and the resulting photosensitive resin composition can have photosensitivity to i-line.

Examples of the organic group represented by each of $R_1$ to $R_3$ include an alkyl group of 1 to 30 carbon atoms, an alkenyl group of 2 to 30 carbon atoms, an alkynyl group of 2 to 30 carbon atoms, an aryl group of 6 to 30 carbon atoms, a heterocyclic group of 4 to 30 carbon atoms, the above groups in which at least one hydrogen atom is replaced by a hydroxyl group, an amino group, a cyano group, a nitro group, or a halogen atom, and the above groups in which an ether bond, a thioether bond, a carbonyl group, an oxycarbonyl group, a thiocarbonyl group, a sulfinyl group, or a sulfonyl group is interposed between carbon atoms to such an extent that the number of carbon atoms is not more than 30. $R_1$ to $R_3$ may be the same or different. Two or more of $R_1$ to $R_3$ may be linked to form a ring structure.

In formula (b2), X is selected from a carbon atom, a nitrogen atom, a phosphorus atom, a boron atom, and an antimony atom. Y is selected from —S(=O)$_2$—, —CF$_2$—O—, —CF$_2$—C(=O)—, —CF$_2$—C(=O)—O—, and —CF$_2$—O—C(=O)—, or X and R$_4$ are directly bonded to each other. R$_4$ represents a hydrocarbon group of 1 to 30 carbon atoms optionally substituted with a fluorine atom, and when Y represents —S(=O)$_2$— or a single bond, the hydrocarbon group represented by R$_4$ has at least one fluorine atom. When X represents a carbon atom, m and n represent integers that satisfy m+n=3 and n=0 to 2. When X represents a nitrogen atom, m and n represent integers that satisfy m+n=2 and n=0 to 1. When X represents a phosphorus or antimony atom, m and n represent integers that satisfy m+n=6 and n=0 to 6. When X represents a boron atom, m and n represent integers that satisfy m+n=4 and n=0 to 3.

Since the photoacid generating agent has the anionic part structure represented by formula (b2), the component (b) can be decomposed by i-line light irradiation so that an acid can be produced from the structure represented by formula (b2).

The produced acid can act to initiate and facilitate the cationic polymerization reaction of the component (a). The acid produced by the decomposition of the component (b) has such a degree of acidity that the component (a) can be sufficiently cured. As used herein, the expression "such a degree of acidity that the component (a) can be sufficiently cured" means that the acid is a strong Lewis acid that is as strong as or stronger than hexafluoroantimonic acid, specifically a strong Lewis acid whose Hammett acidity function —HO is 18 or more, or that the acid is a strong Broensted acid that is as strong as or stronger than nonafluorobutanesulfonic acid, specifically a strong Broensted acid having a PKa of −3.57 or more.

Preferred examples of the cationic part structure represented by formula (b1) include (b1-1) to (b1-26) illustrated below, and preferred examples of the anionic part structure represented by formula (b2) include (b2-1) to (b2-23) illustrated below.

[Chem.4]

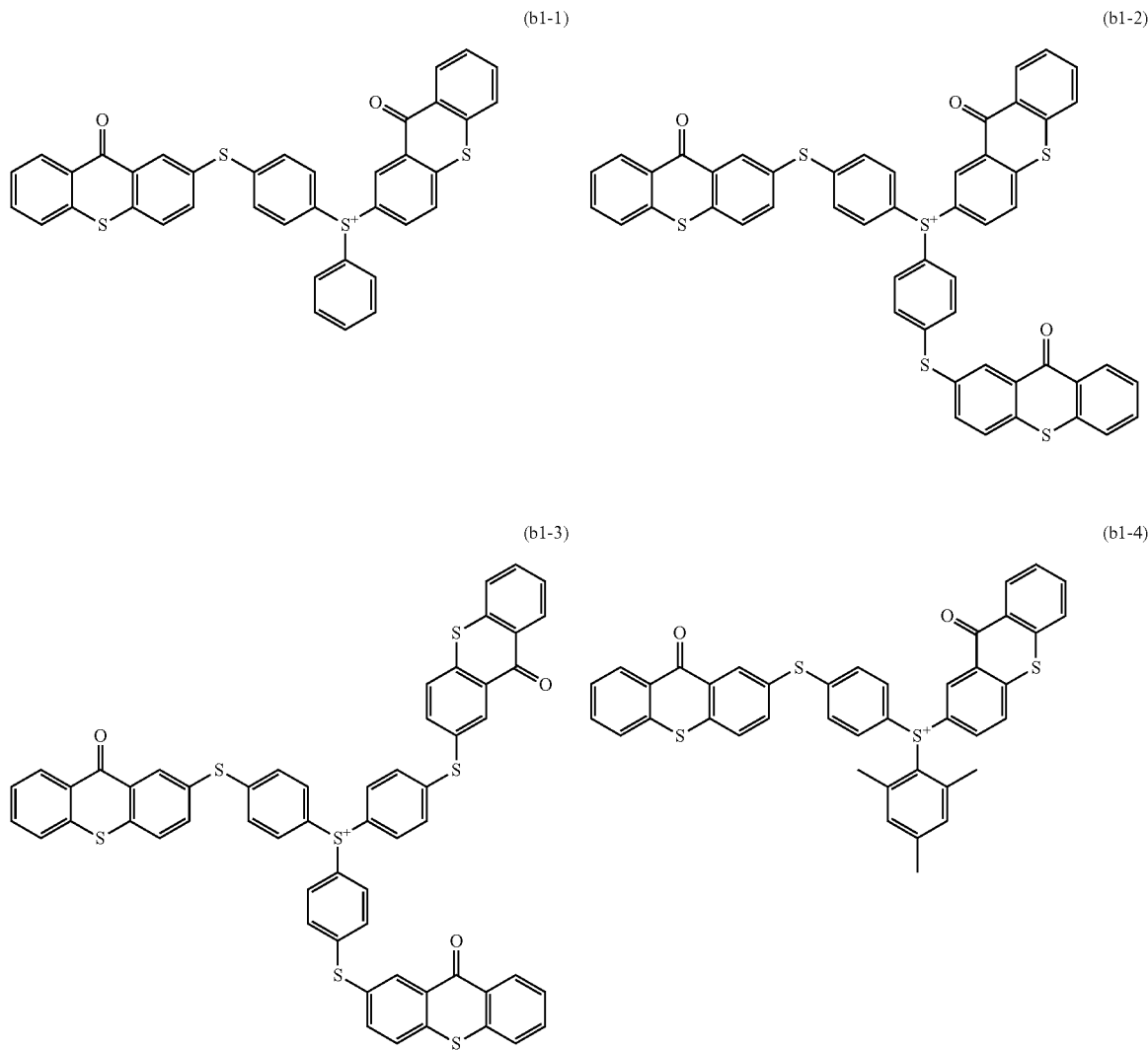

-continued
(b1-5)
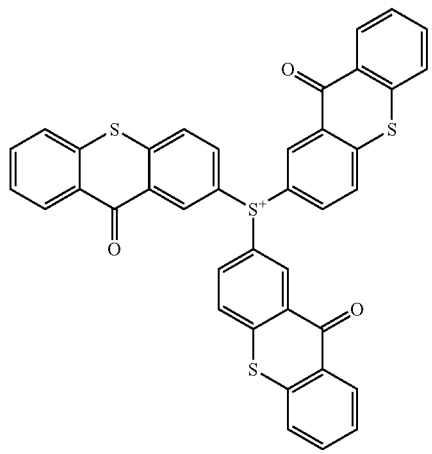
(b1-6)
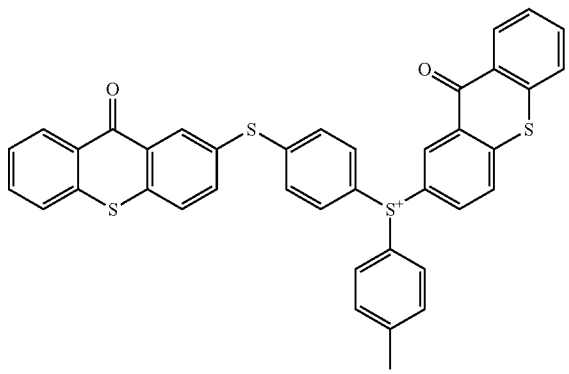
(b1-7)
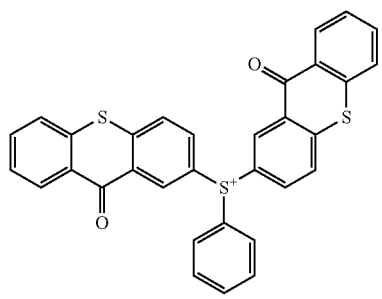
(b1-8)
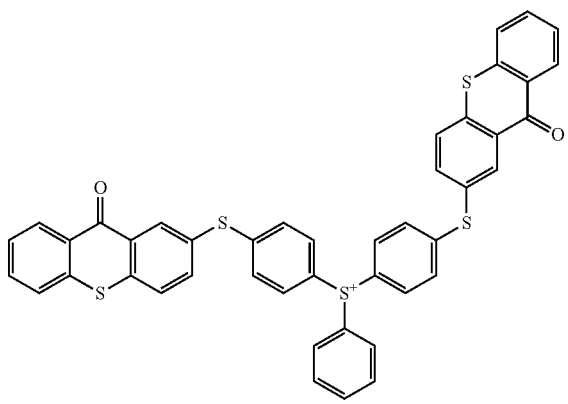
[Chem.5]
(b1-9)
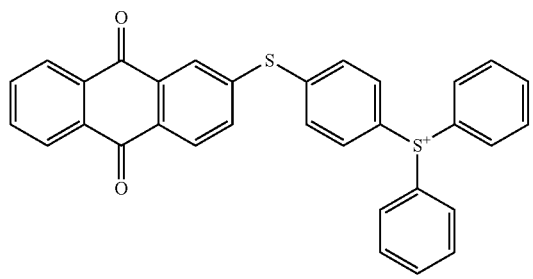
(b1-10)
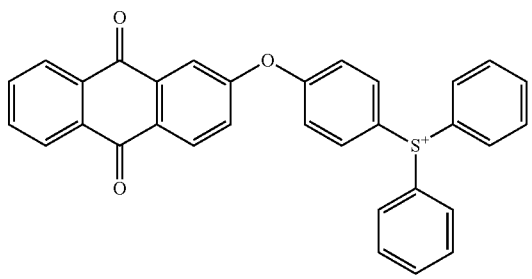
(b1-11)
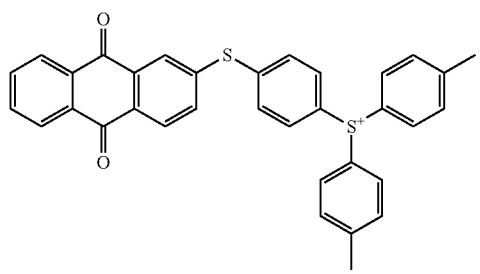
(b1-12)
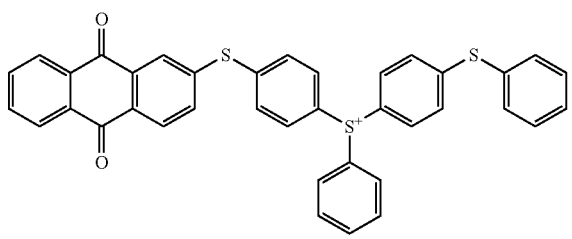

(b1-13)
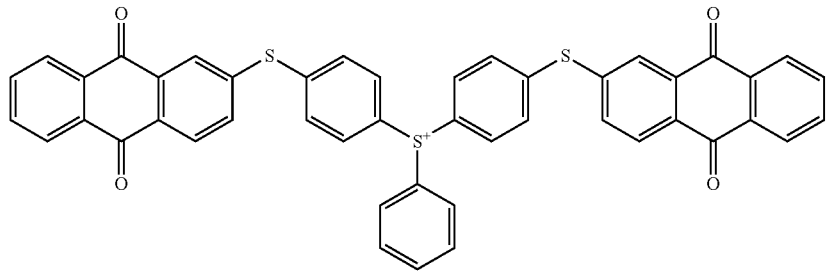
(b1-14) (b1-15)
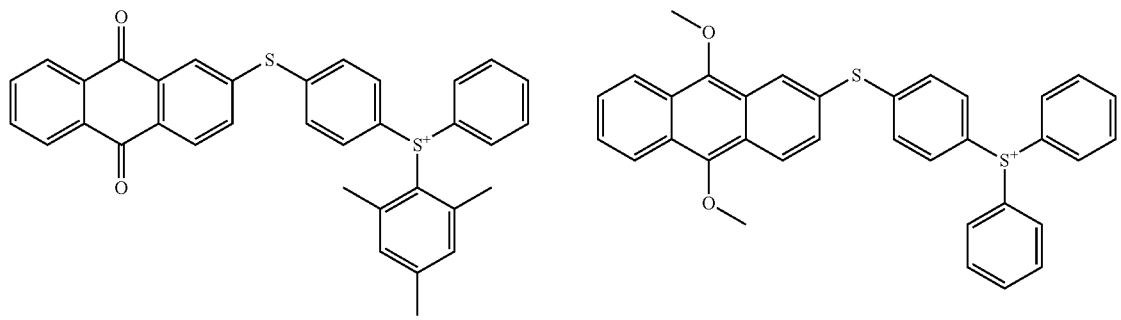
(b1-16) (b1-17)
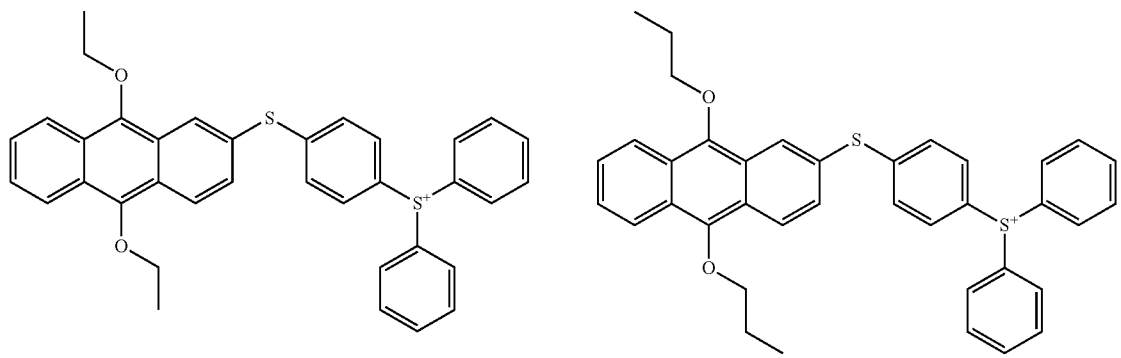
[Chem.6]
(b1-18) (b1-19)
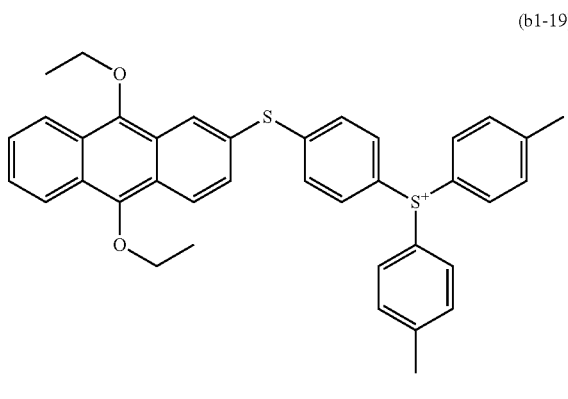

-continued
(b1-20)
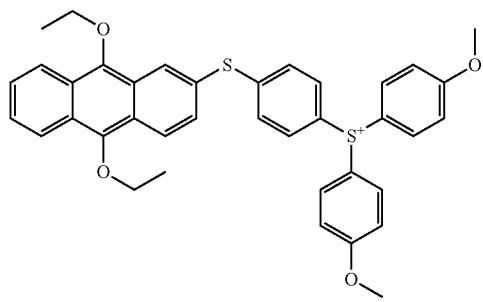
(b1-21)
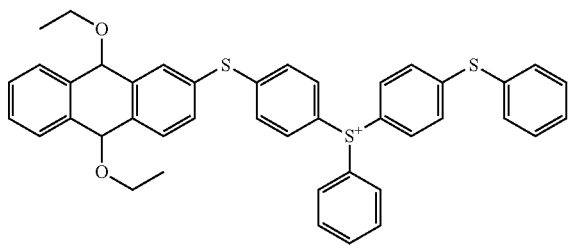
(b1-22)
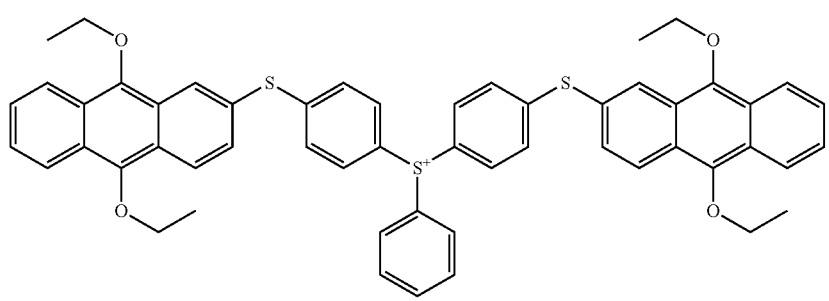
(b1-23)
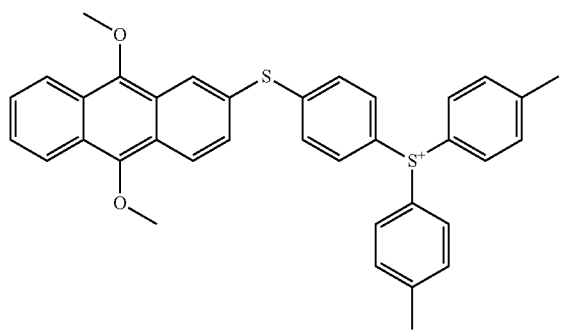
(b1-24)
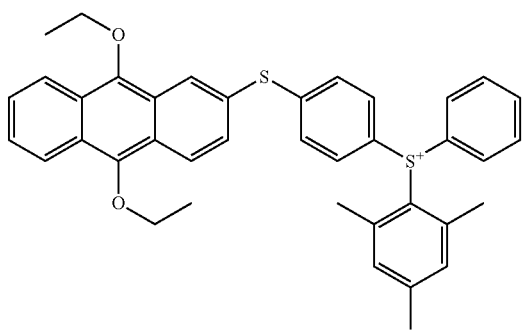
(b1-25)
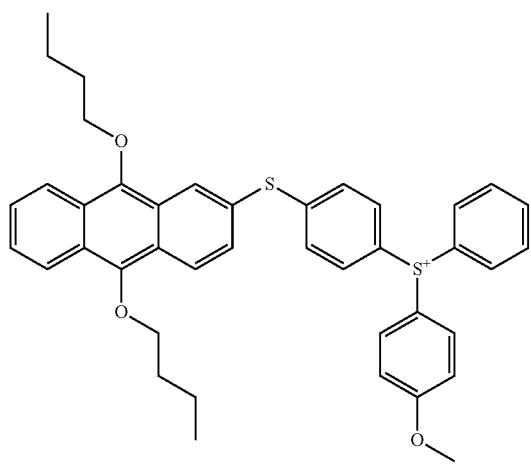
(b1-26)
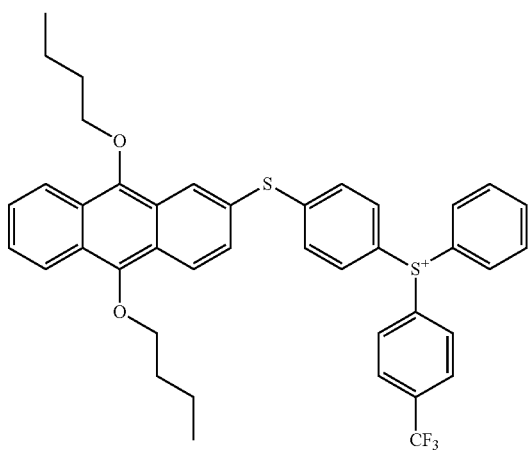

-continued
[Chem.7]
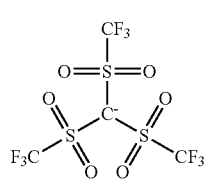
(b2-1)
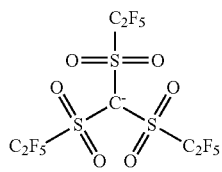
(b2-2)
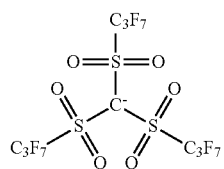
(b2-3)
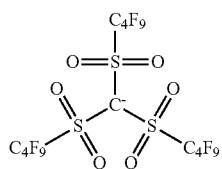
(b2-4)
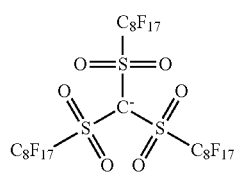
(b2-5)
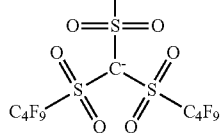
(b2-6)
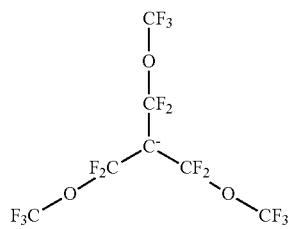
(b2-7)
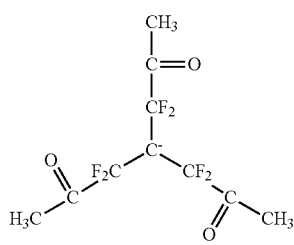
(b2-8)
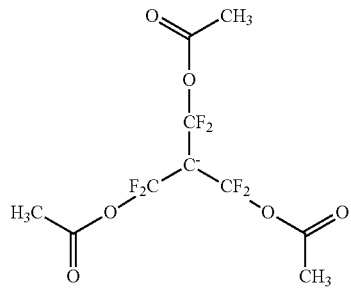
(b2-9)
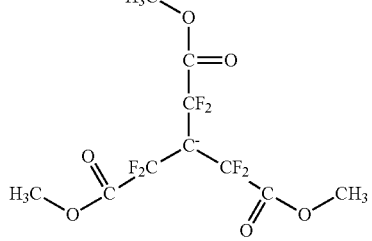
(b2-10)
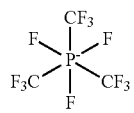
(b2-11)
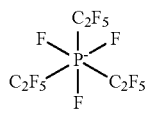
(b2-12)
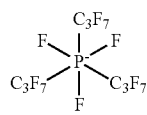
(b2-13)
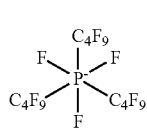
(b2-14)
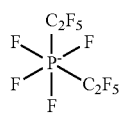
(b2-15)
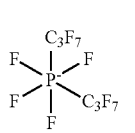
(b2-16)

(b2-17)
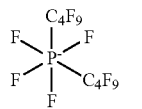

(b2-18)
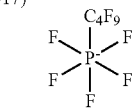

(b2-19)
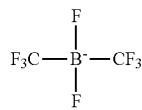

(b2-20)
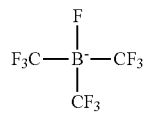

(b2-21)
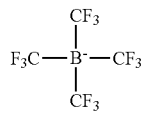

(b2-22)

$$\left( \begin{array}{c} F \\ F \\ F \end{array} \begin{array}{c} F \\ F \end{array} -B^- \right)_4$$

(b2-23)

$SbF_6^-$

A single component (b) or two or more components (b) may be used alone or in combination. The content of the component (b) in the photosensitive resin composition is preferably from 0.01 to 20 parts by weight, more preferably from 0.1 to 10 parts by weight, based on the total solids of the photosensitive resin composition.

In the photosensitive resin composition according to an exemplary embodiment of the present invention, the amount of 365 nm wavelength light absorbed by the component (b) makes up 50% or more of the amount of 365 nm wavelength light absorbed by the photosensitive resin composition. This makes it possible to obtain high photosensitivity and to perform patterning with a highly sensitive exposure. For a further increase in sensitivity, the amount of 365 nm wavelength light absorbed by the component (b) preferably makes up 80% or more of the amount of 365 nm wavelength light absorbed by the photosensitive resin composition.

<(c) Compound Capable of Deactivating the Component (B)-Derived Acid after Exposure to Light>

The photosensitive resin composition according to an exemplary embodiment of the present invention may further contain a compound (component (c)) capable of deactivating the acid produced from the component (b). The compound capable of deactivating the acid is typically a nitrogen atom-containing basic compound, while it is not particularly restricted in terms of chemical structure. The nitrogen atom-containing basic compound refers to a basic compound that contains a nitrogen atom and expresses basic properties derived from the lone-pair electrons of the nitrogen atom. For example, the component (c) can function to trap the acid produced from the photoacid generating agent and to deactivate the acidity. This improves the resolution of patterning by controlling the acid diffusion length in the step of diffusing the acid by heating or deactivates a very small amount of the acid produced from the photoacid generating agent or the like by a dark reaction during the storage of the photosensitive resin composition solution, which brings about the advantage that the variations in the sensitivity are suppressed during storage.

The nitrogen atom-containing basic compound as the component (c) is preferably, but not limited to, a basic compound having two or more nitrogen atoms in different chemical environments. In particular, the nitrogen atom-containing basic compound is preferably a compound containing at least one substituted or unsubstituted amino group and at least one nitrogen atom-containing ring structure, and such a compound more preferably has at least one alkylamino group as the substituted amino group. The nitrogen atom-containing basic compound may be an ionic compound such as a tetraalkyl ammonium salt, or a nonionic compound.

Examples of the nitrogen atom-containing basic compound include guanidine, pyridine, pyrrolidine, indazole, imidazole, pyrazole, pyrazine, pyrimidine, purine, imidazoline, pyrazoline, piperazine, piperidine, and morpholine. These compounds may have a substituent. Examples of the substituent include an amino group, an aminoalkyl group, an alkylamino group, an aminoaryl group, an arylamino group, an alkyl group, an alkoxy group, an acyl group, an allyloxy group, an aryl group, an aryloxy group, a nitro group, a hydroxy group, and a cyano group.

Preferred examples of the nitrogen atom-containing basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 2-aminopyrrolidine, 3-aminopyrrolidine, 1-(2-aminoethyl)pyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

A single component (c) or two or more components (c) may be used alone or in combination. The content of the component (c) in the photosensitive resin composition is preferably from 0.001 to 10 parts by weight, more preferably from 0.01 to 5 parts by weight, based on the total solids of the photosensitive resin composition.

<(d) Low-Molecular-Weight Compound Containing Two or More Benzene Rings or a Condensed Ring in the Molecule>

The photosensitive resin composition according to an exemplary embodiment of the present invention may further contain a low-molecular-weight compound (component (d)) containing two or more benzene rings or a condensed ring in the molecule. The component (d) is a low-molecular-weight compound containing two or more benzene rings or a condensed ring in the molecule, which preferably has such a molecular weight that it is less volatile and remains in a sufficient amount in the formed film, while it is not particularly restricted in terms of chemical structure, as long as it neither corresponds to the component (b) nor to the component (c). The molecular weight of the component (d) is preferably in the range of 100 to 1,100, more preferably in the range of 200 to 900.

The component (d) may have the function of controlling the characteristics of the formed film. For example, it may function to relax the internal stress generated as the curing proceeds, to control the hydrophilicity or repellency of the formed film, or to improve the coating surface profile.

Preferred examples of the component (d) include (d-1) to (d-7) illustrated below.

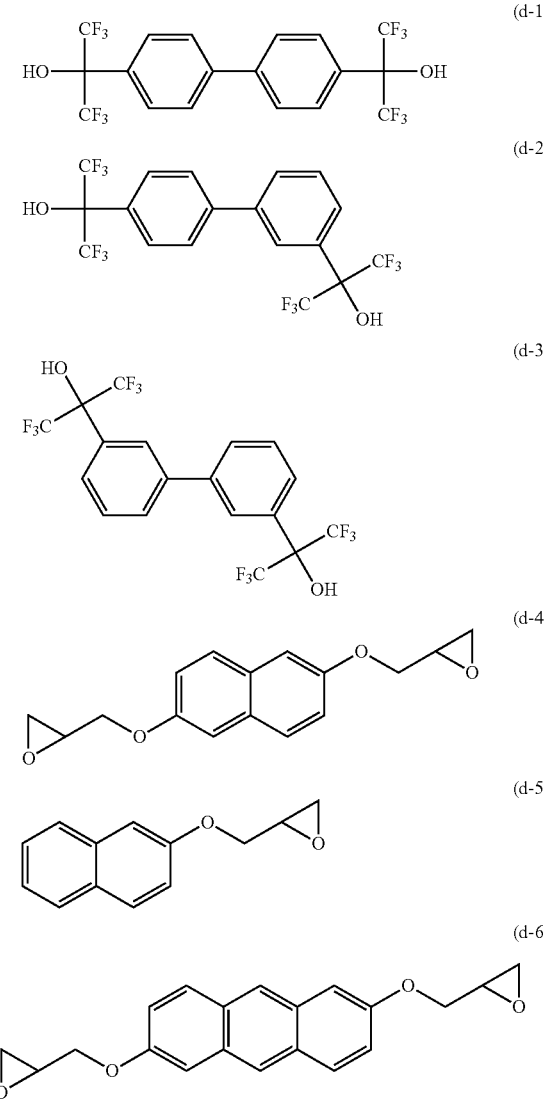

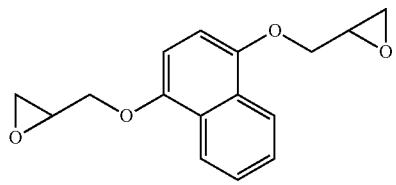

A single component (d) or two or more components (d) may be used alone or in combination. The content of the component (d) in the photosensitive resin composition is preferably from 0.1 to 30 parts by weight, more preferably from 1 to 25 parts by weight, based on the total solids of the photosensitive resin composition.

The photosensitive resin composition according to an exemplary embodiment of the present invention may be applied in various fields, examples of which include, but are not limited to, semiconductor integrated circuit production, semiconductor exposure mask production, and MEMS production. In particular, since the photosensitive resin composition according to an exemplary embodiment of the present invention has a high level of sensitivity and shaping accuracy, it can form sophisticatedly-shaped discharge ports, when used in the production of a liquid discharge head in the field of MEMS.

The liquid discharge head according to an exemplary embodiment of the present invention has a discharge port formed through a layer of the photosensitive resin composition. An example of the liquid discharge head may be, but not limited to, an inkjet recording head having the structure illustrated in FIG. 2.

Figure 2:
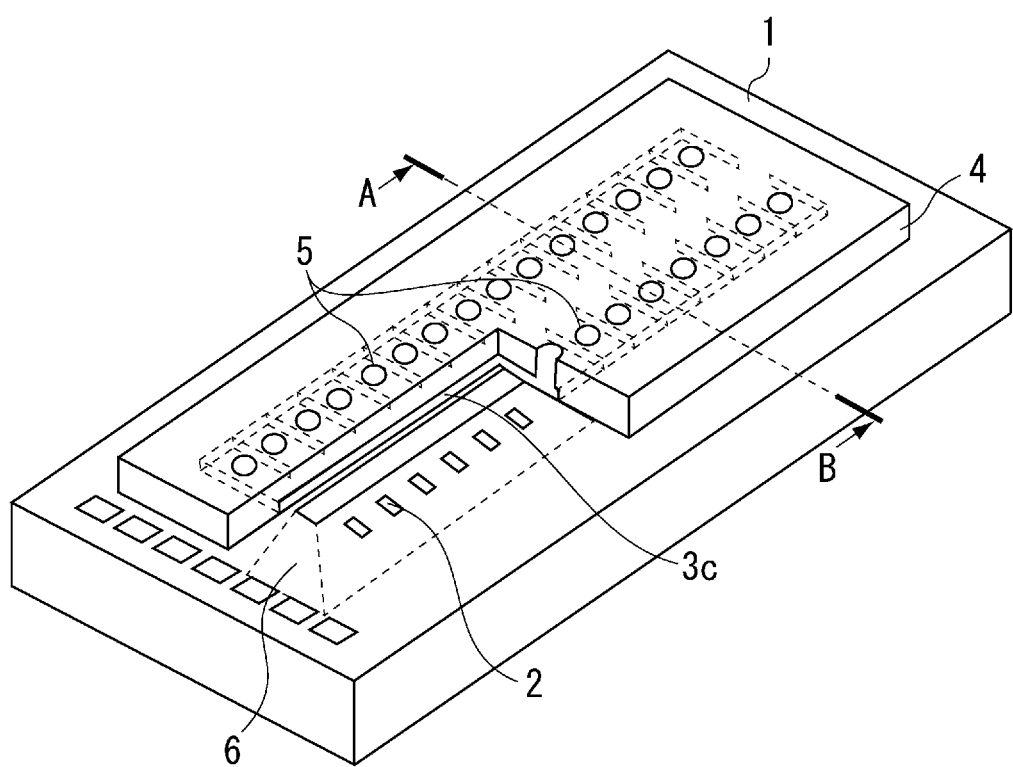
FIG. 2 is a diagram illustrating an example of the structure of an inkjet recording head according to an exemplary embodiment of the present invention.
Figure 3:
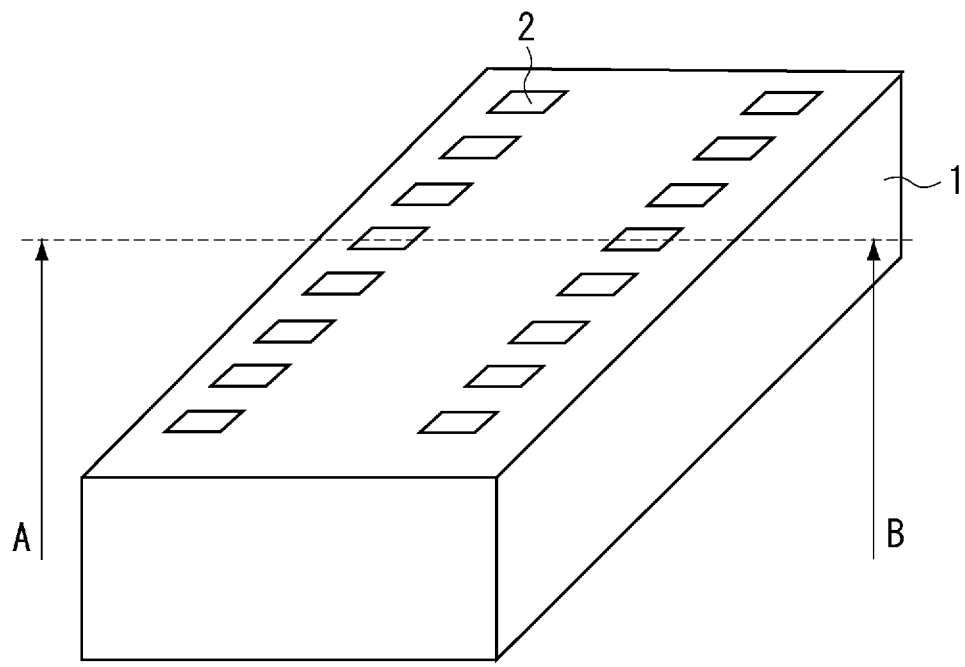
FIG. 3 is a diagram illustrating a structure having a plurality of energy generation elements arranged at predetermined pitches on a substrate illustrated in FIG. 2.
Figure 4A:
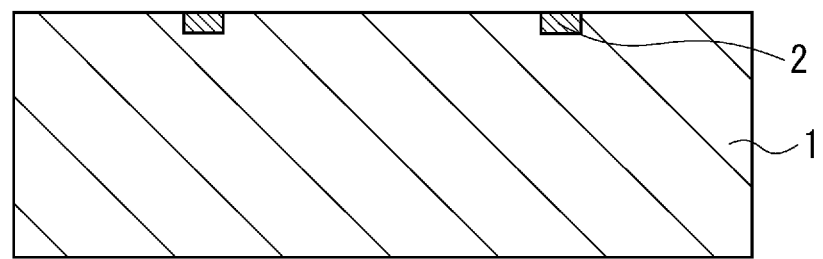
FIG. 4A is a cross-sectional view illustrating a process of manufacturing a liquid discharge head according to an exemplary embodiment of the present invention.

The inkjet recording head illustrated in FIG. 2 includes a substrate 1 having a plurality of energy generation elements 2 and an ink flow path forming layer 4 that is provided on the substrate 1 and forms an ink flow path 3c for holding ink and ink discharge ports 5 for discharging ink which communicate with the ink flow path 3c. The substrate 1 also has an ink supply port 6 through which ink is supplied to the ink flow path 3c. The liquid discharge head according to an exemplary embodiment of the present invention and a method for manufacture thereof are described below with reference to FIG. 2 and FIGS. 4A to 4F illustrating A-B cross-sectional views of FIG. 3. As illustrated in FIGS. 3 and 4A, a plurality of energy generation elements 2 are placed at predetermined pitches on the substrate 1, and the energy generation elements 2 are each connected to a control signal input electrode (not illustrated) for turning on the element.

The substrate 1 is preferably a silicon substrate. In particular, the substrate 1 is preferably a single crystal silicon substrate. When through holes are formed in the substrate 1 by anisotropic etching, the substrate 1 is preferably a single crystal silicon substrate with a crystal orientation of [100]. When through holes are formed in the substrate 1 by dry etching, sand blasting, or laser processing, the substrate 1 may be a single crystal silicon substrate with a crystal orientation of [110].

The energy generation elements 2 may be of any type capable of applying energy to ink so that ink droplets can be discharged from the ink discharge ports. For example, when heat resistor elements are used as the energy generation elements 2, the heat resistor elements heat the ink in the vicinity thereof to change the state of the ink, so that energy for discharge is generated.

Figure 4B:
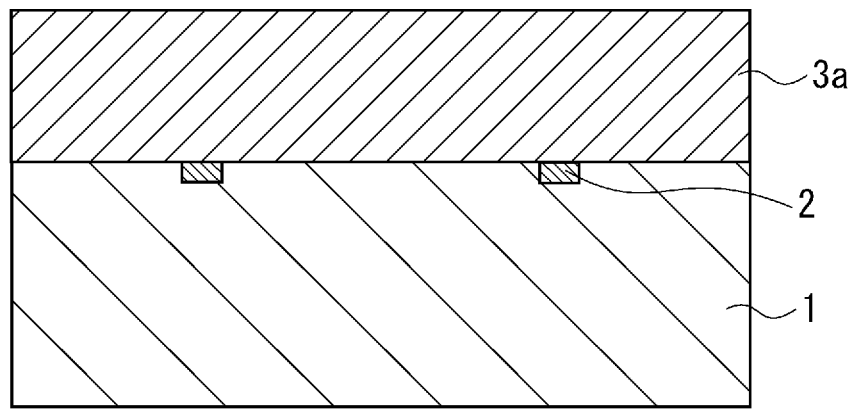
FIG. 4B is a cross-sectional view illustrating the process of manufacturing the liquid discharge head according to an exemplary embodiment of the present invention.

A soluble resin composition is applied to the substrate 1 to form an ink flow path pattern layer 3a (FIG. 4B). A method of forming the ink flow path pattern layer 3a may include dissolving a positive-type photosensitive resin in an appropriate solvent, applying the solution to the substrate 1 by spin coating or any other method, and then heating the coating to form the ink flow path pattern layer 3a. The thickness of the ink flow path pattern layer 3a may be such that an ink flow path with the desired height can be formed, which is preferably, but not limited to, 2 to 50 micrometers.

Figure 4C:
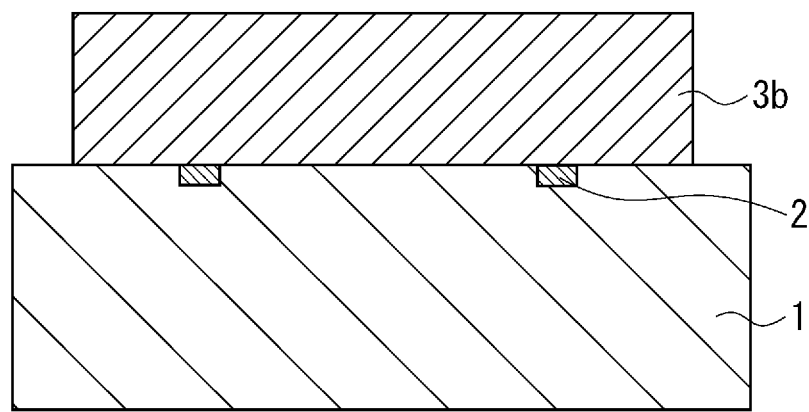
FIG. 4C is a cross-sectional view illustrating the process of manufacturing the liquid discharge head according to an exemplary embodiment of the present invention.

The ink flow path pattern layer 3 is then irradiated with radiation and developed, so that an ink flow path pattern 3b is formed (FIG. 4C).

An ink flow path forming layer 4 is then formed on the ink flow path pattern 3b and the substrate 1 using the photosensitive resin composition according to an exemplary embodiment of the present invention. The thickness of the ink flow path forming layer 4 on the ink flow path pattern 3b is preferably 2 micrometers or more. The upper limit of the thickness of the ink flow path forming layer 4 on the ink flow path pattern 3b is preferably 100 micrometers or less, while it is not particularly restricted as long as it is in the range where the developability for the ink discharge ports is not reduced.

Figure 4D:
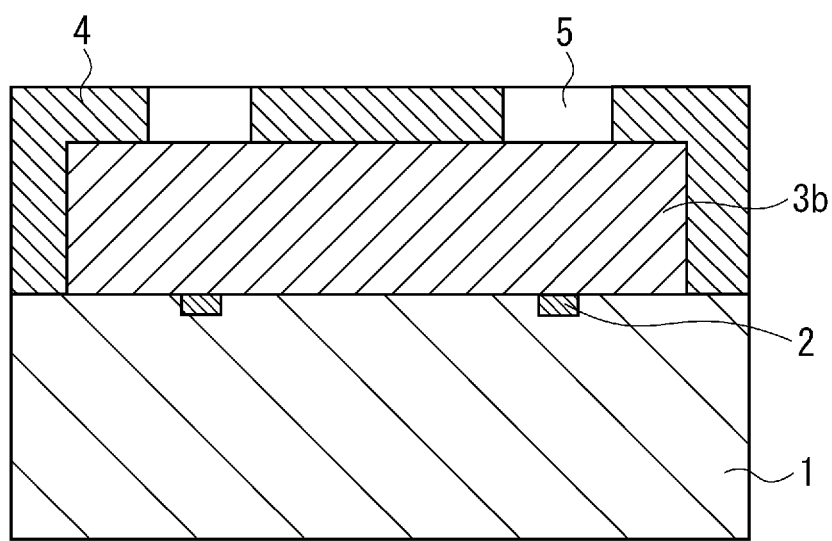
FIG. 4D is a cross-sectional view illustrating the process of manufacturing the liquid discharge head according to an exemplary embodiment of the present invention.
Figure 4E:
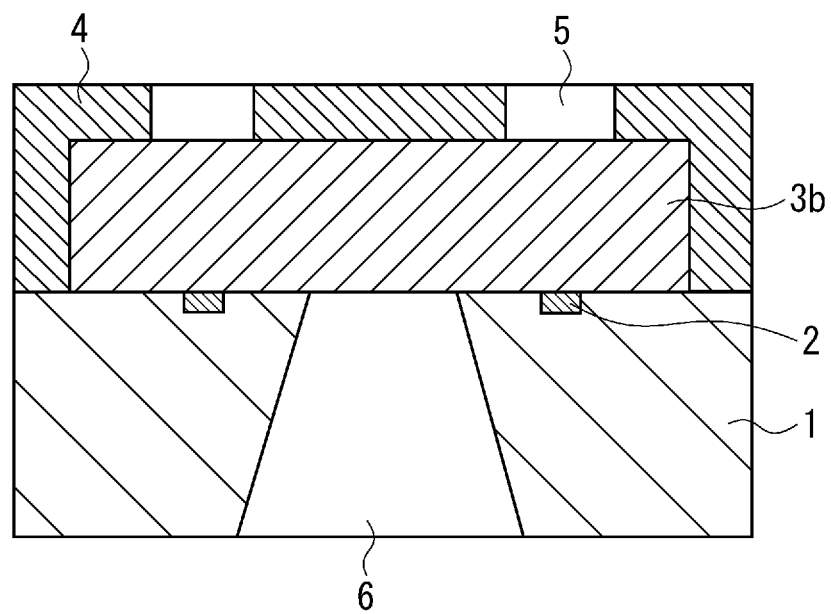
FIG. 4E is a cross-sectional view illustrating the process of manufacturing the liquid discharge head according to an exemplary embodiment of the present invention.

Subsequently, the ink flow path forming layer 4 is irradiated with radiation, then developed with methyl isobutyl ketone (MIBK) or the like, and further subjected to a rinse treatment with IPA or the like, so that ink discharge ports 5 are formed (FIG. 4D). Subsequently, an ink supply port 6 is formed by an appropriate method such as etching (FIG. 4E).

Figure 4F:
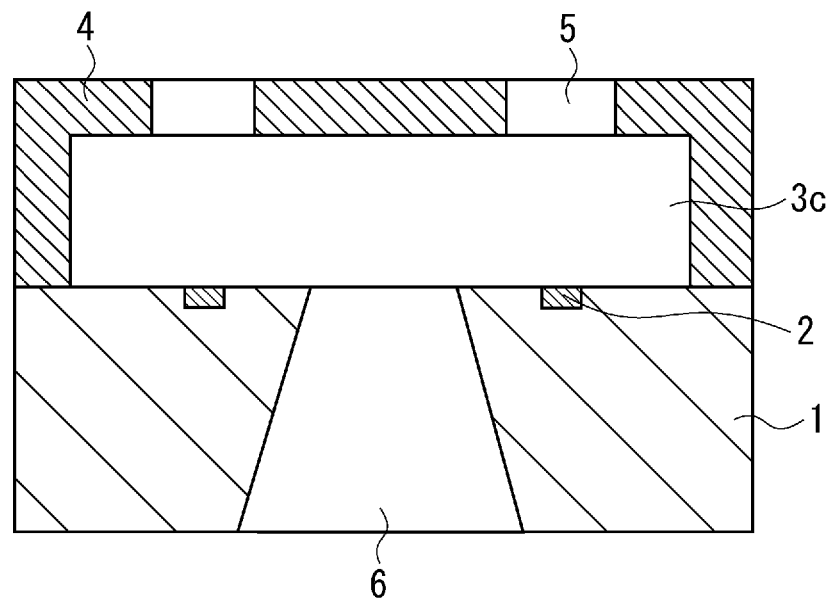
FIG. 4F is a cross-sectional view illustrating the process of manufacturing the liquid discharge head according to an exemplary embodiment of the present invention.

The ink flow path pattern 3b is then dissolved and removed using an appropriate solvent (FIG. 4F). The solvent to be used may be an aqueous alkali solution or an organic solvent.

Subsequently, the substrate 1 is cut and separated into chips using a dicing saw or any other means, and electrical bonding is performed on each chip so that the energy generation elements 2 can be driven. A chip tank component for ink supply is further attached thereto, so that an inkjet recording head is completed.

It will be understood that the above method is useful not only as an inkjet recording head manufacturing method but also as a hollow pattern forming method.

Examples of the present invention are described below, which are not intended to limit the scope of the present invention.

Examples 1 to 9 and Comparative Examples 1 to 4

Photosensitive resin compositions each containing a polyfunctional epoxy resin (the component (a)), a photoacid generating agent (the component (b)), a solvent, and optionally the component (c), the component (d), and/or a sensitizer were prepared according to the formulations (in units of parts by weight) illustrated in Table 1. Concerning the component (b), Table 1 indicates the chemical formulae of the anionic and cationic parts in the Components column. The solvent used was a mixed solvent of propylene glycol monomethyl ether acetate and propylene carbonate (25:1 in weight ratio), and 80 parts by weight of the solvent was added to 100 parts by weight of the component (a).

Each of these photosensitive resin compositions was applied to a supporting material of a silicon wafer using a spin coater and then dried by prebaking at 90 degrees Celsius for 5 minutes, so that a photosensitive resin composition layer with a thickness of 20 micrometers was obtained. After the prebaking, the resin composition layer was subjected to pattern exposure through a mask having the desired pattern using FPA-3000i5+ (trade name of an i-line stepper manufactured by Cannon Inc.) and then subjected to post-exposure baking at 90 degrees Celsius for 4 minutes using a hot plate. Development was then performed using CDS-630+(trade name, manufactured by Cannon Inc.). After the development, the patterned resin on the substrate was subjected to post baking at 140 degrees Celsius for 1 hour using an oven, so that a cured resist pattern was obtained on the supporting material.

Comparative Examples 1 to 3 were performed using a photoacid generating agent containing a sulfonium salt (b1-27) (as an alternative to the component (b)), which does not contain an organic group selected from a thioxanthone skeleton, a 9,10-dialkoxyanthracene skeleton, or an anthraquinone skeleton and in which all the constituent atoms for $R_1$ to $R_3$ contain only one oxygen atom. Comparative Example 4 was performed using a photoacid generating agent containing a sulfonium salt (b1-28) (as an alternative to the component (b)), which does not contain an organic group selected from a thioxanthone skeleton, a 9,10-dialkoxyanthracene skeleton, or an anthraquinone skeleton and in which all the constituent atoms for $R_1$ to $R_3$ contain no oxygen atom.

<Evaluation>

(Sensitivity)

Using the mask illustrated in FIG. 1, a negative-type resist pattern was formed by transferring a model pattern having an elliptic nozzle port pattern with a design size of 20 micrometers (major axis)*16 micrometers (minor axis) and a bridge line pattern (represented by c in FIG. 1) with a width of 3 micrometers across the ellipse along the minor axis. When this pattern was formed, i-line exposure was performed with the amount of light exposure gradually changed in the range of 500 to 20,000 $J/m^2$, and the amount of light exposure required to form the pattern with the design size was determined.

(Shaping Accuracy)

The part at which the bridge line pattern intersects with the ellipse was observed using a scanning electron microscope (SEM), when the resolution was determined. A virtual straight line was drawn from an end (represented by a in FIG. 1) of the crescent shape, which will be formed if the resist pattern is formed according to the design of the mask pattern, along the edge of the bridge line pattern. The shaping accuracy (in units of micrometers) was defined as the length (represented by b in FIG. 1) of the virtual straight line drawn to the point where it intersects with the actually developed pattern. If the actually developed pattern reaches the end (a in FIG. 1) of the crescent shape, the shaping accuracy will be 0 micrometer, which means that the pattern accords with the design size. However, as the shaping accuracy degrades, the cured material remains at the end (a in FIG. 1) of the crescent shape. Thus, the shaping accuracy value is determined by how much the cured material spreads.

(Absorption Ratio)

For absorbance evaluation, two compositions were first prepared as described below.

<Composition 1>

The photosensitive resin composition obtained as described above.

<Composition 2>

A photosensitive resin composition was obtained by the same method as described above, except that the component (b) was not added.

Next, the compositions 1 and 2 were each applied to a supporting material of quartz glass using a spin coater and then dried by prebaking at 90 degrees Celsius for 5 minutes, so that resin composition layers 1 and 2 with a thickness of about 20 micrometers were each obtained. The absorbance (in units of Abs) of each of the resin composition layers 1 and 2 was measured at a wavelength of 365 nm using a spectrophotometer Model U-3300 (trade name, manufactured by Hitachi Ltd.). The thickness of each of the resin composition layers 1 and 2 was also measured (in units of micrometers). The ratio of the amount of 365 nm wavelength light absorbed by the component (b) to the amount of 365 nm wavelength light absorbed by the photosensitive resin composition was calculated from the measurement results according to the formula below. The calculated value is called the absorption ratio (in units of %).

<Calculation Formula>

Absorption ratio={[(the absorbance of the resin composition layer 1/the thickness of the resin composition layer 1)–(the absorbance of the resin composition layer 2/the thickness of the resin composition layer 2)]/(the absorbance of the resin composition layer 1/the thickness of the resin composition layer 1)}*100

The results are summarized in Table 1.

TABLE 1

| | | Examples | | |
|---|---|---|---|---|
| Components | | 1 | 2 | 3 |
| Component (a) | a-1 | 100 | — | — |
| | a-2 | — | 100 | 100 |
| | a-3 | — | — | — |
| Component (b) | b1-1/b2-12 | 5 | 5 | — |
| | b1-2/b2-11 | — | — | 5 |
| | b1-18/b2-1 | — | — | — |
| | b1-16/b2-2 | — | — | — |
| | b1-14/b2-22 | — | — | — |
| | b1-27/b2-23 | — | — | — |
| | b1-28/b2-1 | — | — | — |
| Component (c) | c-1 | 0.25 | — | 0.25 |
| Component (d) | d-1 | 10 | 10 | 10 |
| Sensitizer | e-1 | — | — | — |
| Absorption ratio (%) | | 85 | 82 | 83 |
| Light exposure amount (J/m$^2$) | | 3500 | 1000 | 4000 |
| Shaping accuracy (micrometer) | | <0.5 | 2.0 | <0.5 |

TABLE 2

| | | Examples | | |
|---|---|---|---|---|
| Components | | 4 | 5 | 6 |
| Component (a) | a-1 | 100 | 100 | — |
| | a-2 | — | — | 100 |
| | a-3 | — | — | — |
| Component (b) | b1-1/b2-12 | — | — | — |
| | b1-2/b2-11 | — | — | — |
| | b1-18/b2-1 | 5 | — | — |
| | b1-16/b2-2 | — | 5 | — |
| | b1-14/b2-22 | — | — | 5 |
| | b1-27/b2-23 | — | — | — |
| | b1-28/b2-1 | — | — | — |
| Component (c) | c-1 | 0.25 | 0.25 | 0.25 |
| Component (d) | d-1 | 10 | 10 | 10 |
| Sensitizer | e-1 | — | — | — |
| Absorption ratio (%) | | 85 | 86 | 82 |
| Light exposure amount (J/m$^2$) | | 3500 | 3500 | 4000 |
| Shaping accuracy (micrometer) | | <0.5 | <0.5 | <0.5 |

TABLE 3

| | | Examples | | |
|---|---|---|---|---|
| Components | | 7 | 8 | 9 |
| Component (a) | a-1 | — | — | — |
| | a-2 | — | — | — |
| | a-3 | 100 | 100 | 100 |

TABLE 3-continued

| | | Examples | | |
|---|---|---|---|---|
| Components | | 7 | 8 | 9 |
| Component (b) | b1-1/b2-12 | 5 | 5 | 2.5 |
| | b1-2/b2-11 | — | — | — |
| | b1-18/b2-1 | — | — | — |
| | b1-16/b2-2 | — | — | — |
| | b1-14/b2-22 | — | — | — |
| | b1-27/b2-23 | — | — | — |
| | b1-28/b2-1 | — | — | — |
| Component (c) | c-1 | 0.25 | 0.25 | 0.25 |
| Component (d) | d-1 | 20 | 20 | — |
| Sensitizer | e-1 | — | 0.10 | 0.20 |
| Absorption ratio (%) | | 96 | 78 | 52 |
| Light exposure amount (J/m$^2$) | | 3000 | 2500 | 2500 |
| Shaping accuracy (micrometer) | | <0.5 | 1.5 | 1.8 |

TABLE 4

| | | Comparative Examples | | | |
|---|---|---|---|---|---|
| Components | | 1 | 2 | 3 | 4 |
| Component (a) | a-1 | 100 | 100 | — | — |
| | a-2 | — | — | 100 | 100 |
| | a-3 | — | — | — | — |
| Component (b) | b1-1/b2-12 | — | — | — | — |
| | b1-2/b2-11 | — | — | — | — |
| | b1-18/b2-1 | — | — | — | — |
| | b1-16/b2-2 | — | — | — | — |
| | b1-14/b2-22 | — | — | — | — |
| | b1-27/b2-23 | 5 | 5 | 5 | — |
| | b1-28/b2-1 | — | — | — | 5 |
| Component (c) | c-1 | 0.25 | — | 0.25 | — |
| Component (d) | d-1 | 10 | 10 | 10 | — |
| Sensitizer | e-1 | — | — | 0.32 | 1 |
| Absorption ratio (%) | | 86 | 85 | 48 | 1 |
| Light exposure amount (J/m$^2$) | | 11000 | 4000 | 8000 | 4000 |
| Shaping accuracy (micrometer) | | 2.5 | 3.0 | 3.5 | 4.0 |

(a-1): EPICLON N-865 (trade name, manufactured by DIC Corporation) with an epoxy equivalent of 210 and a softening point of 68 degrees Celsius
(a-2): JER157S70 (trade name, manufactured by Japan Epoxy Resins Co., Ltd.) with an epoxy equivalent of 210 and a softening point of 70 degrees Celsius
(a-3): EHPE 3150 (trade name, manufactured by DAICEL CHEMICAL INDUSTRIES, LTD) with an epoxy equivalent of 180 and a softening point of 85 degrees Celsius
(b1-27):
[Chem. 9]

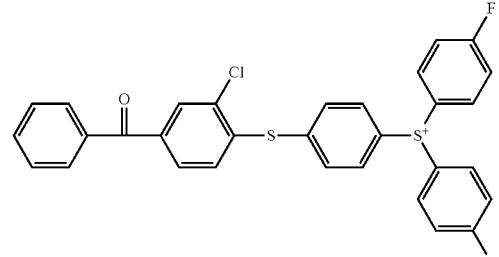

(b1-28): triphenylsulfonium
(c-1): 4-aminoethylpyridine
(d-1): 1-naphthol

In Examples 1 to 9, the model pattern for a droplet discharge port was successfully formed with a small amount of light exposure of 4,000 J/m$^2$ or less. At this time, the shaping accuracy was as fine as 2.0 micrometers or less.

In contrast, when the cationic part structure represented by formula (b1) contained only one oxygen atom or no oxygen atom as in Comparative Examples 1 to 4, high sensitivity, specifically, both a small amount of light exposure and fine shaping accuracy were not satisfied. When the rate of the absorption of exposure light by the component (b) is low as in Comparative Examples 3 and 4, specifically, when the absorption ratio is less than 50%, a reduction in the shaping accuracy was observed.

As described above, patterning with high sensitivity and high shaping accuracy can be performed using the photosensitive resin composition according to an exemplary embodiment of the present invention. Therefore, the photosensitive resin composition according to an exemplary embodiment of the present invention is suitable for use in the production of various micro-fabricated devices for MEMS and other systems.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-024681 filed Feb. 5, 2010, which is hereby incorporated by reference herein in its entirety.

The invention claimed is:

1. A photosensitive resin composition comprising:
   (a) a compound polymerizable in the presence of an acid;
   (b) a photoacid generating agent comprising an onium salt having a cationic part structure represented by formula (b1) below and an anionic part structure represented by formula (b2) below; and
   (c) a compound capable of deactivating an acid produced from the component (b) after exposure to light,
   wherein the component (b) absorbs at least 50% of the amount of 365 nm wavelength light absorbed by the photosensitive resin composition,

[Chem. 1]

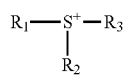
   (b1)

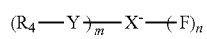
   (b2)

wherein $R_1$ to $R_3$ each independently represent an organic group of 1 to 30 carbon atoms, $R_1$ to $R_3$ represent structures containing at least two oxygen atoms and comprising at least one organic group selected from a thioxanthone skeleton, a 9,10-dialkoxyanthracene skeleton, or an anthraquinone skeleton, X is selected from a carbon atom, a nitrogen atom, a phosphorus atom, a boron atom, and an antimony atom, Y is at least one selected from —S(=O)$_2$—, —CF$_2$—O—, —CF$_2$—C(=O)—, —CF$_2$—C(=O)—O—, and —CF$_2$—O—C(=O)—, or X and $R_4$ are directly bonded to each other, $R_4$ represents a hydrocarbon group of 1 to 30 carbon atoms, provided that when Y represents —S(=O)$_2$— or a single bond, the hydrocarbon group represented by $R_4$ has at least one fluorine atom, and when X represents a carbon atom, m and n represent integers that satisfy m+n=3 and n=0 to 2, when X represents a nitrogen atom, m and n represent integers that satisfy m+n=2 and n=0 to 1, when X represents a phosphorus or antimony atom, m and n represent integers that satisfy m+n=6 and n=0 to 6, or when X represents a boron atom, m and n represent integers that satisfy m+n=4 and n=0 to 3.

2. The photosensitive resin composition according to claim 1, wherein X in the component (b) represents a phosphorous atom.

3. The photosensitive resin composition according to claim 2, wherein the structures of the component (b) represented by $R_1$ to $R_3$ comprise at least two thioxanthone skeletons, Y represents a single bond, $R_4$ represents CF$_3$ or C$_2$F$_5$, and m is at least 3.

4. The photosensitive resin composition according to claim 1, further comprising (d) a low-molecular-weight compound containing two or more benzene rings or a condensed ring in its molecule.

5. A method for producing a structure, the method comprising in this order:
   providing a substrate provided with a layer of a photosensitive resin composition for forming a structure, the photosensitive resin composition comprising:
   (a) a compound polymerizable in the presence of an acid;
   (b) a photoacid generating agent comprising an onium salt having a cationic part structure represented by formula (b1) below and an anionic part structure represented by formula (b2) below; and
   (c) a compound capable of deactivating an acid produced from the component (b) after exposure to light,
   wherein the component (b) absorbs at least 50% of the amount of 365 nm wavelength light absorbed by the photosensitive resin composition,

[Chem. 2]

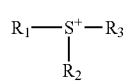
   (b1)

   (b2)

wherein $R_1$ to $R_3$ each independently represent an organic group of 1 to 30 carbon atoms, $R_1$ to $R_3$ represent structures containing at least two oxygen atoms and comprising at least one organic group selected from a thioxanthone skeleton, a 9,10-dialkoxyanthracene skeleton, or an anthraquinone skeleton, X is selected from a carbon atom, a nitrogen atom, a phosphorus atom, a boron atom, and an antimony atom, Y is at least one selected from —S(=O)$_2$—, —CF$_2$—O—, —CF$_2$—C(=O)—, —CF$_2$—C(=O)—O—, and —CF$_2$—O—C(=O)—, or X and $R_4$ are directly bonded to each other, $R_4$ represents a hydrocarbon group of 1 to 30 carbon atoms, provided that when Y represents —S(=O)$_2$— or a single bond, the hydrocarbon group represented by $R_4$ has at least one fluorine atom, and when X represents a carbon atom, m and n represent integers that satisfy m+n=3 and n=0 to 2, when X represents a nitrogen atom, m and n represent integers that satisfy m+n=2 and n=0 to 1, when X represents a phosphorus or antimony atom, m and n represent integers that satisfy m+n=6 and n=0 to 6, or when X represents a boron atom, m and n represent integers that satisfy m+n=4 and n=0 to 3;
   exposing the layer to light, then curing the exposed part and removing the uncured part; and
   heating the cured part at a temperature of at least 140 degrees Celsius to form a structure.

6. A liquid discharge head comprising:
   a discharge port member having a discharge port configured to discharge a liquid, wherein the discharge port member is made of a product of curing of a photosensitive resin composition comprising:
(a) a compound polymerizable in the presence of an acid; and
(b) a photoacid generating agent comprising an onium salt having a cationic part structure represented by formula (b1) below and an anionic part structure represented by formula (b2) below,
wherein the component (b) absorbs at least 50% of the amount of 365 nm wavelength light absorbed by the photosensitive resin composition,

[Chem. 3]

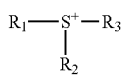 (b1)

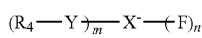 (b2)

wherein $R_1$ to $R_3$ each independently represent an organic group of 1 to 30 carbon atoms, $R_1$ to $R_3$ represent structures containing at least two oxygen atoms and comprising at least one organic group selected from a thioxanthone skeleton, a 9,10-dialkoxyanthracene skeleton, or an anthraquinone skeleton, X is selected from a carbon atom, a nitrogen atom, a phosphorus atom, a boron atom, and an antimony atom, Y is at least one selected from —S(=O)$_2$—, —CF$_2$—O—, —CF$_2$—C(=O)—, —CF$_2$—C(=O)—O—, and —CF$_2$—O—C(=O)—, or X and $R_4$ are directly bonded to each other, $R_4$ represents a hydrocarbon group of 1 to 30 carbon atoms, provided that when Y represents —S(=O)$_2$— or a single bond, the hydrocarbon group represented by $R_4$ has at least one fluorine atom, and when X represents a carbon atom, m and n represent integers that satisfy m+n=3 and n=0 to 2, when X represents a nitrogen atom, m and n represent integers that satisfy m+n=2 and n=0 to 1, when X represents a phosphorus or antimony atom, m and n represent integers that satisfy m+n=6 and n=0 to 6, or when X represents a boron atom, m and n represent integers that satisfy m+n=4 and n=0 to 3.

7. The liquid discharge head according to claim 6, wherein X in the component (b) represents a phosphorous atom.

8. The liquid discharge head according to claim 6, wherein the structures of the component (b) represented by $R_1$ to $R_3$ comprise at least two thioxanthone skeletons, Y represents a single bond, $R_4$ represents CF$_3$ or C$_2$F$_5$, and m is at least 3.

9. The liquid discharge head according to claim 6, further comprising (c) a compound capable of deactivating an acid produced from the component (b) after exposure to light.

10. The liquid discharge head according to claim 6, further comprising (d) a low-molecular-weight compound containing two or more benzene rings or a condensed ring in its molecule.

11. The liquid discharge head according to claim 6, wherein the discharge port member made of the product of curing of the photosensitive resin composition is formed by:
providing a substrate provided with a layer of the photosensitive resin composition for forming a structure,
exposing the layer to light, then curing the exposed part and removing the uncured part; and
heating the cured part at a temperature of at least 140 degrees Celsius to form the structure.

12. The photosensitive resin composition according to claim 4, wherein the component (d) is one of a phenyl compound, a naphthalene compound, and an anthracene compound, the compounds having one of substituted groups represented by the following formulas

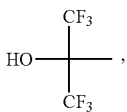 , 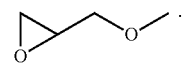 .

13. The photosensitive resin composition according to claim 4, wherein the component (d) has one of the following structures (d-1) to (d-7):

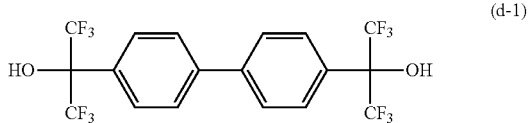 (d-1)

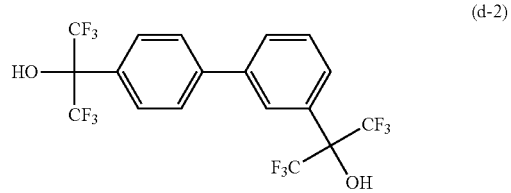 (d-2)

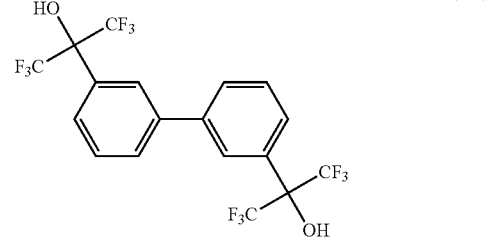 (d-3)

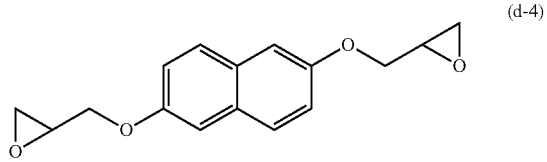 (d-4)

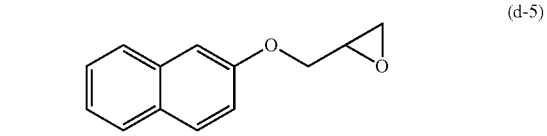 (d-5)

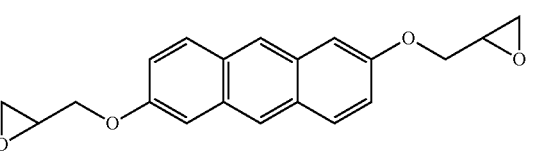 (d-6)

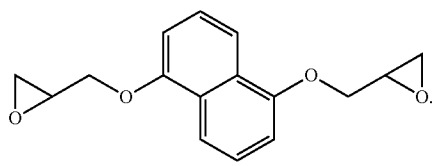
(d-7)
14. A liquid discharge head according to claim 10, wherein the component (d) is one of a phenyl compound, a naphthalene compound, and an anthracene compound, the compounds having one of substituted groups represented by the following formulas
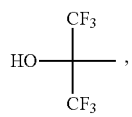 , 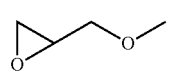
15. A liquid discharge head according to claim 10, wherein the component (d) has one of the following structures (d-1) to (d-7):
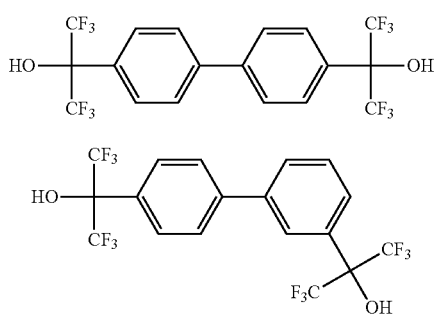
(d-1)
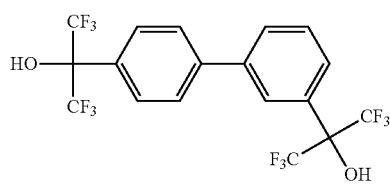
(d-2)
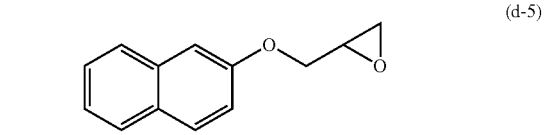
(d-3)
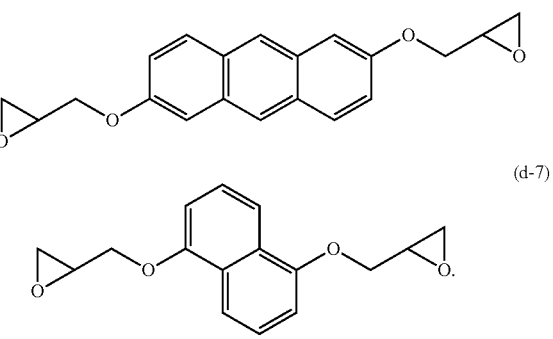
(d-4)
(d-5)
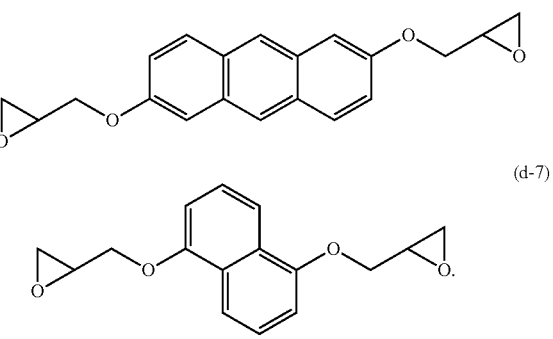
(d-6)
(d-7)
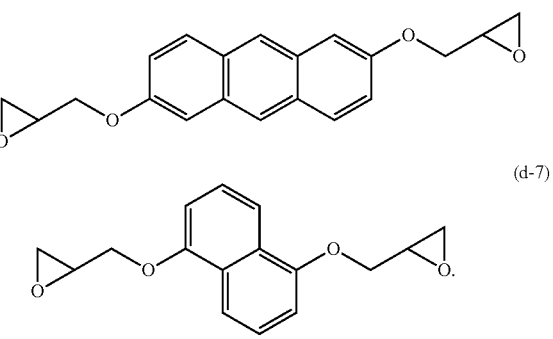
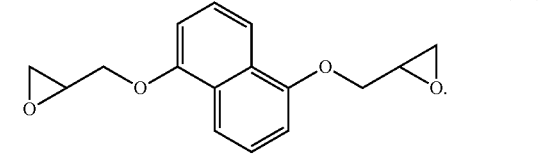
\* \* \* \* \*